(12) United States Patent
Tang et al.

(10) Patent No.: US 10,684,316 B2
(45) Date of Patent: Jun. 16, 2020

(54) VOLTAGE DETECTION CIRCUIT FOR CHARGE PUMP

(71) Applicant: Wuhan Xinxin Semiconductor Manufacturing Co., Ltd., Wuhan, Hubei (CN)

(72) Inventors: Yuan Tang, San Jose, CA (US); Shiou-Yu Alex Wang, San Jose, CA (US); Jen-Tai Hsu, San Jose, CA (US); Zhifeng Mao, Hubei (CN); Sean Chen, San Jose, CA (US)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 0 days.

(21) Appl. No.: 16/228,332

(22) Filed: Dec. 20, 2018

(65) Prior Publication Data

US 2019/0317140 A1   Oct. 17, 2019

(30) Foreign Application Priority Data

Apr. 16, 2018   (CN) .......................... 2018 1 0338025

(51) Int. Cl.
*H03K 5/153*   (2006.01)
*G01R 19/25*   (2006.01)
(Continued)

(52) U.S. Cl.
CPC .......... *G01R 19/2503* (2013.01); *H02M 3/07* (2013.01); *H03K 3/037* (2013.01); *H03K 5/24* (2013.01);
(Continued)

(58) Field of Classification Search
CPC ........ H03K 5/2481; H03K 5/249; H03K 5/08; H03K 5/24; G01R 19/16519
(Continued)

(56) References Cited

U.S. PATENT DOCUMENTS

| 5,488,320 A * | 1/1996 | Carvella ............. H03K 5/2481 |
| | | 327/203 |
| 6,535,424 B2 * | 3/2003 | Le ........................... G11C 8/08 |
| | | 365/185.18 |

(Continued)

FOREIGN PATENT DOCUMENTS

| CN | 101871963 A | 10/2010 |
| CN | 102707124 A | 10/2012 |

(Continued)

*Primary Examiner* — Anh Q Tra
(74) *Attorney, Agent, or Firm* — Muncy, Geissler, Olds & Lowe, P.C.

(57) ABSTRACT

A voltage detection circuit for a charge pump is disclosed. The voltage detection circuit includes a sampling circuit and a latch circuit. The sampling circuit is configured to sample a supply voltage and provide the latch circuit with a sampled voltage. The latch circuit is configured to detect the sampled voltage and latch a result of the detection. And the latch circuit is connected to a voltage regulation circuit which is configured to regulate a charge-pump cascade structure in the charge pump based on the result of the detection so as to maintain an output voltage of the charge pump stable.

12 Claims, 2 Drawing Sheets

(51) Int. Cl.
*H02M 3/07* (2006.01)
*H03K 3/037* (2006.01)
*H03K 5/24* (2006.01)
*H03K 19/20* (2006.01)
*H03K 5/00* (2006.01)

(52) U.S. Cl.
CPC ... *H03K 19/20* (2013.01); *H03K 2005/00026* (2013.01)

(58) Field of Classification Search
USPC .......................................... 327/65, 77, 536
See application file for complete search history.

(56) References Cited

U.S. PATENT DOCUMENTS

| | | | | |
|---|---|---|---|---|
| 6,970,032 | B1* | 11/2005 | Smith | H03K 19/018528 327/407 |
| 7,085,190 | B2* | 8/2006 | Worley | G11C 8/08 365/189.11 |
| 7,545,203 | B2* | 6/2009 | Byeon | G11C 5/145 327/536 |
| 2002/0149400 | A1* | 10/2002 | Kocaman | H03K 19/01707 327/65 |
| 2007/0120590 | A1* | 5/2007 | Gou | H02M 3/073 327/536 |

FOREIGN PATENT DOCUMENTS

| | | |
|---|---|---|
| CN | 103904882 A | 7/2014 |
| CN | 106645893 A | 5/2017 |

\* cited by examiner

US 10,684,316 B2

VOLTAGE DETECTION CIRCUIT FOR CHARGE PUMP

CROSS-REFERENCE TO RELATED APPLICATION

This application claims the priority of Chinese patent application number 201810338025.0, filed on Apr. 16, 2018, the entire contents of which are incorporated herein by reference.

TECHNICAL FIELD

The present invention relates to the field of semiconductor technology and, in particular, to a voltage detection circuit for a charge pump.

BACKGROUND

A charge pump circuit is a basic block for a flash memory and greatly affects the device's program/erase speed. The continuous advancement of integrated circuit (IC) fabrication technology and our relentless pursuit for lower power consumption lead to the development of ICs powered by increasingly lower supply voltages.

On the other hand, in flash memories, program/erase operations of a cell still require relatively high voltages. In such a context, more and more importance is being attached to charge pump circuits in the continuously-developing IC domain. Currently, charge pumps have become a focus of research efforts in the field of flash memory design.

A charge pump, also known as a switched-capacitor voltage converter, is a kind of DC to DC converter that uses so-called "flying" or "pumping" capacitors (rather than inductors or transformers) for energetic charge storage to raise, lower an input voltage or to produce a negative voltage. An internal field effect transistors (FET) switch array of the charge pump controls transfer of electric charge among the capacitors in a certain manner (usually, uses clock signals to control the charge/discharge of the capacitors) so that the input voltage is raised (or reduced) in a certain way to a desired output level.

However, when powered with a supply voltage that is not accurate or varies in a wide range, an existing charge pump tends to produce an inaccurate, unreliable output voltage

SUMMARY OF THE INVENTION

It is an object of the present invention to provide a voltage detection circuit for a charge pump such that the charge pump could be powered with a more accurate supply voltage.

To this end, the present invention provides a voltage detection circuit for a charge pump, comprising a sampling circuit and a latch circuit, wherein:

the sampling circuit is configured to sample a supply voltage and provide the latch circuit with a sampled voltage;

the latch circuit is configured to detect the sampled voltage and latch a result of the detection; and the latch circuit is connected to a voltage regulation circuit which is configured to regulate a cascade structure of the charge pump based on the result of the detection so as to maintain an output voltage of the charge pump stable.

Optionally, in the voltage detection circuit, the sampling circuit may comprise a plurality of resistors connected in series into a series circuit, the series circuit being coupled to the supply voltage at one end and grounded at the other end.

Optionally, in the voltage detection circuit, the number of the plurality of resistors in the sampling circuit may be 100.

Optionally, in the voltage detection circuit, the latch circuit may comprise a first inverter and a second inverter, wherein:

the first inverter has an input connected to an output of the second inverter; the first inverter has an output connected to an input of the second inverter; the input of the first inverter is coupled to the result of the detection; and the output of the first inverter is connected to the voltage regulation circuit.

Optionally, in the voltage detection circuit, the latch circuit may further comprise a comparator, wherein:

the comparator has a non-inverting input coupled to the sampled voltage, an inverting input coupled to a reference voltage and an output that is connected to the input of the first inverter and configured to output the result of the detection.

Optionally, in the voltage detection circuit, the latch circuit may further comprise a first switch through which the supply voltage powers the comparator.

Optionally, in the voltage detection circuit, the latch circuit may further comprise a second switch connected between the input of the first inverter and the output of the second inverter.

Optionally, the voltage detection circuit may further comprise a signal generation circuit, wherein:

the signal generation circuit comprises a pulse generator, a delayer and a first AND gate;

the pulse generator is provided with a mode generating signal which causes the pulse generator to output a first switch enable signal and a second switch signal;

the delayer is configured to output a delayed signal, wherein the delayed signal has a rising edge aligned with a falling edge of a signal provided to the delayer, and a falling edge lagging behind a rising edge of the signal provided to the delayer by a first period;

upon the mode generating signal creating a rising edge, the first switch enable signal jumps to a rising edge, and the second switch signal jumps to a falling edge and then to a rising edge a second period later;

the second switch signal is provided to the delayer, the delayed signal to a first input of the first AND gate and the first switch enable signal to a second input of the first AND gate, and the first AND gate is configured to output a first switch signal;

upon the first switch signal jumping to a rising edge, the first switch is controlled to be closed and upon the first switch signal jumping to a falling edge, the first switch is controlled to be opened; and upon the second switch signal jumping to a rising edge, the second switch is controlled to be closed and upon the second switch signal jumping to a falling edge, the second switch is controlled to be opened.

Optionally, in the voltage detection circuit, the first period is 5 ns and the second period is 10 ns to 30 ns Optionally, the voltage detection circuit may further comprise a third switch, wherein:

upon an enable signal jumping to a rising edge, the third switch is controlled to be closed and upon an enable signal jumping to a falling edge, the third switch is controlled to be opened; and after the mode generating signal has jumped to the rising edge, the enable signal jumps to a rising edge upon the first switch signal jumping to the falling edge.

The present invention further provides a voltage detection circuit for a charge pump, comprising a sampling circuit and a latch circuit, wherein:

the sampling circuit is configured to sample a supply voltage and provide the sampled voltage to the latch circuit;

the latch circuit is configured to detect the sampled voltage and latch a result of the detection;

the latch circuit is connected to a voltage regulation circuit which is configured to regulate a cascade structure of the charge pump based on the result of the detection so as to maintain an output voltage of the charge pump stable; and the latch circuit comprises a comparator having a non-inverting input coupled to the sampled voltage, an inverting input coupled to a reference voltage, and an output configured to output the result of the detection.

Optionally, in the voltage detection circuit, the sampling circuit comprises a plurality of resistors connected in series into a series circuit, the series circuit being coupled to the supply voltage at one end and grounded at the other end.

Optionally, in the voltage detection circuit, a number of the plurality of resistors in the sampling circuit is 100.

Optionally, in the voltage detection circuit, the latch circuit further comprises a first inverter and a second inverter. The first inverter has an input connected to an output of the second inverter. The first inverter has an output connected to an input of the second inverter. The input of the first inverter is coupled to the output of the comparator. The output of the first inverter is connected to the voltage regulation circuit.

Optionally, in the voltage detection circuit, the latch circuit further comprises a first switch through which the supply voltage powers the comparator.

Optionally, in the voltage detection circuit, the latch circuit further comprises a second switch connected between the input of the first inverter and the output of the second inverter.

Optionally, the voltage detection circuit further comprises a signal generation circuit, wherein:

the signal generation circuit comprises a pulse generator, a delayer and a first AND gate;

the pulse generator is provided with a mode generating signal which causes the pulse generator to output a first switch enable signal and a second switch signal;

the delayer is configured to output a delayed signal, wherein the delayed signal has a rising edge aligned with a falling edge of a signal provided to the delayer and a falling edge lagging behind a rising edge of the signal provided to the delayer by a first period;

upon the mode generating signal creating a rising edge, the first switch enable signal jumps to a rising edge, and the second switch signal jumps to a falling edge and then to a rising edge a second period later;

the second switch signal is provided to the delayer, the delayed signal to a first input of the first AND gate and the first switch enable signal to a second input of the first AND gate, and the first AND gate is configured to output a first switch signal;

upon the first switch signal jumping to a rising edge, the first switch is controlled to be closed and upon the first switch signal jumping to a falling edge, the first switch is controlled to be opened; and upon the second switch signal jumping to a rising edge, the second switch is controlled to be closed and upon the second switch signal jumping to a falling edge, the second switch is controlled to be opened.

Optionally, in the voltage detection circuit, the first period is 5 ns and the second period is 10 ns to 30 ns.

Optionally, the voltage detection circuit further comprises a third switch, wherein:

upon an enable signal jumping to a rising edge, the third switch is controlled to be closed and upon the enable signal jumping to a falling edge, the third switch is controlled to be opened; and after the mode generating signal has jumped to the rising edge, the enable signal jumps to a rising edge upon the first switch signal jumping to the falling edge.

In the voltage detection circuit of the present invention, the sampling circuit samples the supply voltage and provides the latch circuit with the sampled voltage, and the latch circuit detects the sampled voltage and latches the result of the detection. Additionally, the latch circuit is connected to the voltage regulation circuit which regulates the charge-pump cascade structure in the charge pump based on the result of the detection so as to maintain the output voltage of the charge pump stable. This design enables the detection of the supply voltage and hence improved stability and accuracy of the output voltage of the charge pump. In addition, the supply voltage is allowed to vary in a wide range. Further, the wide-range supply voltage for powering the charge pump is allowed to be provided by a high-power power supply which offers the advantages of low power consumption, a small footprint and a compact reference voltage circuit while ensuring good regulation of the charge pump's voltage output.

Furthermore, when the voltage detection circuit is used to detect the voltage level of the supply voltage VCC, the supply voltage may be adjusted to an appropriate value for an active mode regardless of whether the charge pump is activated or not. As the result of the detection is latched before the activation of the charge pump, it will not be affected by any change in the supply voltage that may occur due to an extreme active current generated upon the activation of the charge pump. Moreover, in order to ensure the correctness of the latched result, the latch circuit is activated within a short time prior to the completion of the detection. Lastly, as the voltage detection circuit consumes power only when the first switch signal is at a high level, thus its power consumption is relatively low.

In these figures: 10, a voltage regulation circuit; 20, a charge pump; 30, a pulse generator; 40, a delayer; 50, a sampling circuit; and 60, a latch circuit.

DETAILED DESCRIPTION

The present invention will be described below in further detail with reference to the accompanying drawings and some specific embodiments. Features and advantages of the invention will be more apparent from the following detailed description, and from the appended claims. It is noted that the figures are provided in a very simplified form not necessarily presented to scale, with the only intention to facilitate convenience and clarity in explaining the embodiments of the invention.

The core idea of the present invention is to provide a voltage detection circuit for a charge pump such that the charge pump could be powered with a more accurate supply voltage.

To this end, the present invention provides a voltage detection circuit for a charge pump, comprising a sampling circuit and a latch circuit. The sampling circuit is configured to sample a supply voltage and provide the latch circuit with a sampled voltage. The latch circuit is configured to detect the sampled voltage and latch a result of the detection. The latch circuit is connected to a voltage regulation circuit which is configured to regulate a charge-pump cascade structure in the charge pump based on the result of the detection so as to maintain an output voltage of the charge pump stable.

Figure 1:
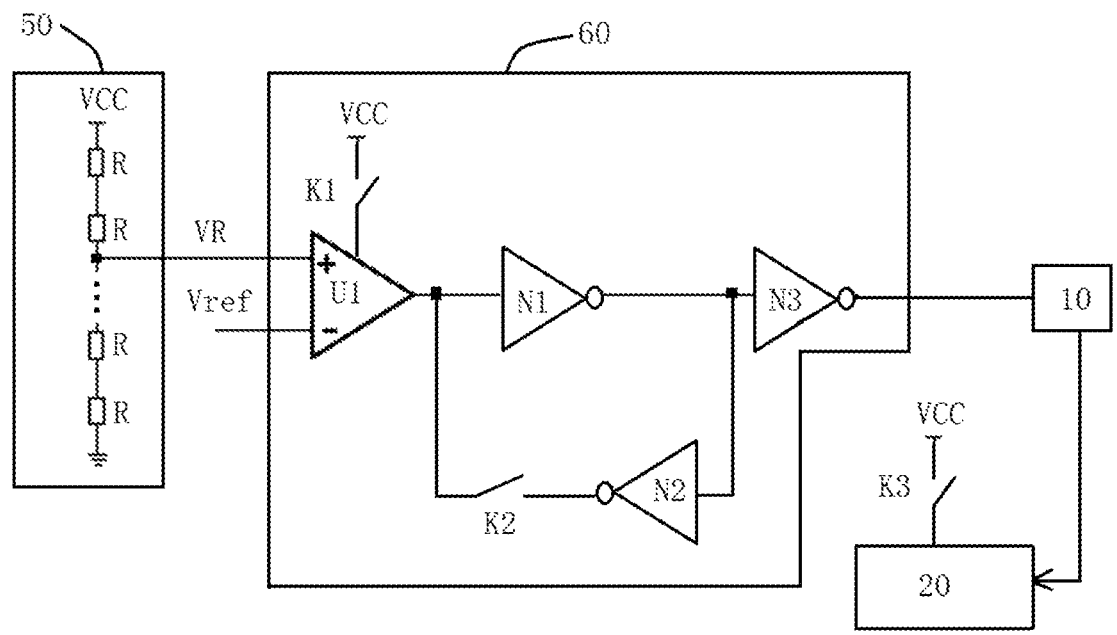
FIG. 1 is a schematic illustration of a voltage detection circuit for a charge pump according to an embodiment of the present invention.

As shown in FIG. 1, a voltage detection circuit for a charge pump constructed according to an embodiment of the present invention includes a sampling circuit 50 and a latch circuit 60. The sampling circuit 50 is configured to sample a supply voltage VCC and provide the latch circuit 60 with a sampled voltage VR. The latch circuit 60 is configured to detect the sampled voltage VR and latch a result of the detection. And the latch circuit 60 is connected to a voltage regulation circuit 10 which is configured to regulate a charge-pump cascade structure in the charge pump 20 based on the result of the detection so as to maintain an output voltage of the charge pump 20 stable.

In particular, in the voltage detection circuit, the sampling circuit 50 may include a plurality of resistors R connected in series into a circuit that is coupled to the supply voltage VCC at one end and ground at the other end. The number of the resistors may be 100. The latch circuit 60 may include a first inverter N1, a second inverter N2 and a third inverter N3. An input of the first inverter N1 is connected to an output of the second inverter N2. An output of the first inverter N1 is connected to an input of the second inverter N2. The input of the first inverter N1 is coupled to the result of the detection. And the output of the first inverter N1 is connected to the voltage regulation circuit 10 via the third inverter N3. In other words, the result of the detection is inverted by the third inverter and then input to the voltage regulation circuit 10. The latch circuit 60 may include a comparator U1 having a non-inverting input coupled to the sampled voltage VR, an inverting input coupled to a reference voltage Vref, and an output that is connected to the input of the first inverter N1 and outputs the result of the detection.

Figure 2:
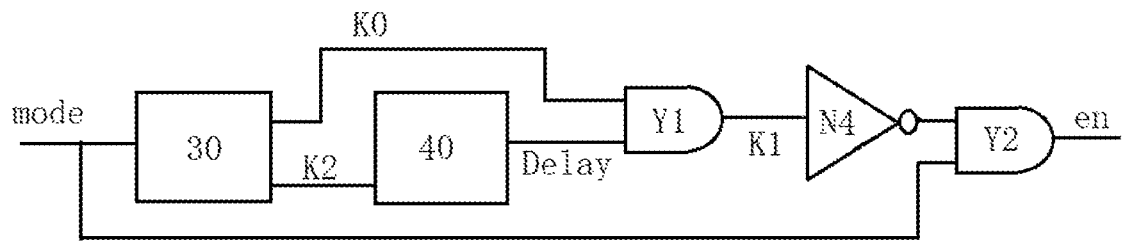
FIG. 2 is a schematic illustration of a signal generation circuit in a voltage detection circuit for a charge pump according to another embodiment of the present invention.
Figure 3:
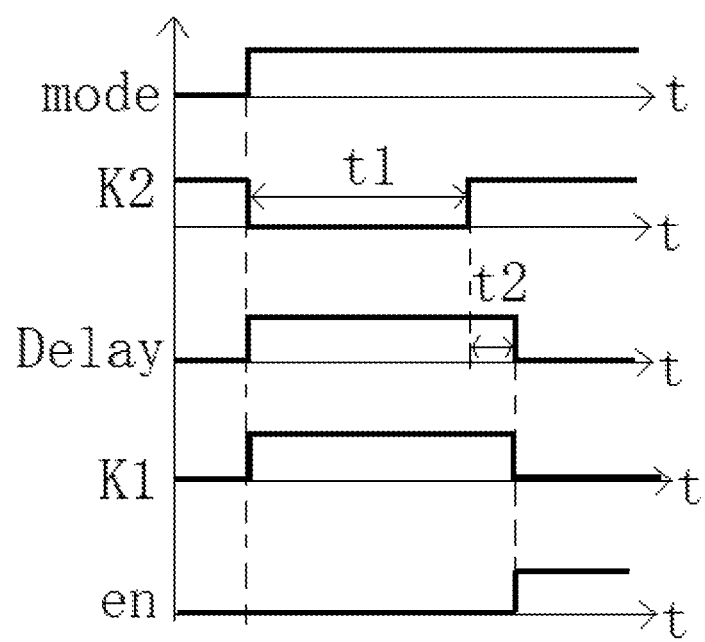
FIG. 3 schematically illustrates waveforms of various signals in a voltage detection circuit for a charge pump according to another embodiment of the present invention.

Additionally, in the voltage detection circuit, the latch circuit 60 may further include a first switch K1 through which the supply voltage VCC powers the comparator U1. The latch circuit 60 may further include a second switch K2 connected between the input of the first inverter N1 and the output of the second inverter N2. As shown in FIG. 2, the voltage detection circuit may further include a signal generation circuit. The signal generation circuit includes a pulse generator 30, a delayer 40, a fourth inverter N4, a first AND gate Y1 and a second AND gate Y2. The pulse generator 30 is provided with a mode generating signal MODE which causes the pulse generator 30 to output a first switch enable signal KO and a second switch signal K2. As shown in FIG. 3, upon the mode generating signal MODE jumping to a rising edge, the first switch enable signal KO jumps to a rising edge (as same as K1), and the second switch signal K2 jumps to a falling edge and then to a rising edge a second period later (this time can be determined based on practical requirements). The delayer 40 outputs a delayed signal Delay. As shown in FIG. 3, the delayed signal has a rising edge aligned with a falling edge of a signal provided to the delayer 40 (e.g., as shown in FIG. 2, the second switch signal K2 is provided to the delayer 40), and a falling edge lagging behind a rising edge of the signal provided to the delayer 40 by a first period. As shown in FIG. 3, the delayed signal Delay rises or falls with the rising or falling of the second switch signal K2 and is provided to a first input of the first AND gate Y1, with the first switch enable signal KO being provided to a second input of the first AND gate Y1. Additionally, the first AND gate Y1 is configured to output a first switch signal K1. As shown in FIG. 3, since each of KO and Delay is maintained at a high level within the time periods t1 and t2, the first switch signal K1 is also kept at a high level within these periods. At the end of t2, Delay jumps to a falling edge, thus the first switch signal K1 output from the first AND gate Y1 jumps to a falling edge responsively.

Additionally, in FIG. 1, upon the first switch signal K1 jumps to a rising edge, the first switch K1 may be controlled to be closed and upon the first switch signal K1 jumps to a falling edge, the first switch K1 may be controlled to be opened. Upon the second switch signal K2 jumps to a rising edge, the second switch K2 is controlled to be closed and upon the second switch signal K2 jumps to a falling edge, the second switch K2 is controlled to be opened. The first period may be 5 ns and the second period may be 10 ns to 30 ns.

In addition, as shown in FIG. 1, the voltage detection circuit may further include a third switch K3. Upon an enable signal EN jumping to a rising edge, the third switch K3 may be controlled to be closed and upon an enable signal EN jumping to a falling edge, the third switch K3 may be controlled to be opened. After the mode generating signal MODE has jumped to the rising edge, the enable signal EN may create a rising edge upon the first switch signal K1 creating the falling edge. In a particular implementation, as shown in FIG. 2, the first switch signal K1 may be provided, via the fourth inverter, to a first input of the second AND gate Y2, and the mode generating signal MODE to a second input of the second AND gate Y2. In this way, at the end of t2, the enable signal EN jumps to a rising edge such that the third switch is closed and hence the charge pump is activated.

In the voltage detection circuit of the present invention, the sampling circuit 50 samples the supply voltage VCC and provides the latch circuit 60 with the sampled voltage VR, and the latch circuit 60 detects the sampled voltage VR and latches the result of the detection. Additionally, the latch circuit 60 is connected to the voltage regulation circuit 10 which regulates the cascade structure of the charge pump 20 based on the result of the detection so as to maintain the output voltage of the charge pump 20 stable. This design enables the detection of the supply voltage VCC and hence improved stability and accuracy of the output voltage of the charge pump 20. In addition, the supply voltage VCC is allowed to vary in a wide range. Further, the wide-range supply voltage VCC for powering the charge pump 20 is allowed to be provided by a high-power power supply which offers the advantages of low power consumption, a small footprint and a compact reference voltage circuit while ensuring good regulation of the voltage output of the charge pump 20.

Furthermore, when the voltage detection circuit is used to detect the voltage level of the supply voltage VCC, the supply voltage VCC may be adjusted to an appropriate value for an active mode regardless of whether the charge pump 20 is activated or not. As the result of the detection is latched before the activation of the charge pump 20, it will not be affected by any change in the supply voltage VCC that may occur due to an extreme active current generated upon the activation of the charge pump 20. Moreover, in order to ensure the correctness of the latched result, the latch circuit 60 is activated within a short time prior to the completion of the detection. Lastly, as the voltage detection circuit consumes power only when the first switch signal K1 is at a high level, thus its power consumption is relatively low.

In summary, various configurations of the voltage detection circuit have been detailed in the above embodiments. Of course, the present invention includes, but not limited to, the configurations disclosed above, and any and all modifications made to these configurations are considered to fall within the scope of the invention. Those skilled in the art can extend the inventive ideas in many ways.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. A voltage detection circuit for a charge pump, comprising a sampling circuit and a latch circuit, wherein:
   the sampling circuit is configured to sample a supply voltage and provide the sampled voltage to the latch circuit;
   the latch circuit is configured to detect the sampled voltage and latch a result of the detection; and
   the latch circuit is connected to a voltage regulation circuit which is configured to regulate a cascade structure of the charge pump based on the result of the detection so as to maintain an output voltage of the charge pump stable;
   wherein the latch circuit comprises a first inverter and a second inverter,
   the first inverter having an input connected to an output of the second inverter, the first inverter having an output connected to an input of the second inverter, the input of the first inverter coupled to the result of the detection, the output of the first inverter connected to the voltage regulation circuit;
   wherein the latch circuit further comprises a comparator, the comparator having a non-inverting input coupled to the sampled voltage, an inverting input coupled to a reference voltage, and an output that is connected to the input of the first inverter and configured to output the result of the detection;
   wherein the latch circuit further comprises a first switch through which the supply voltage powers the comparator, and a second switch connected between the input of the first inverter and the output of the second inverter;
   wherein the voltage detection circuit further comprises a signal generation circuit, wherein:
   the signal generation circuit comprises a pulse generator, a delayer and a first AND gate;
   the pulse generator is provided with a mode generating signal which causes the pulse generator to output a first switch enable signal and a second switch signal;
   the delayer is configured to output a delayed signal, wherein the delayed signal has a rising edge aligned with a falling edge of a signal provided to the delayer and a falling edge lagging behind a rising edge of the signal provided to the delayer by a first period;
   upon the mode generating signal creating a rising edge, the first switch enable signal jumps to a rising edge, and the second switch signal jumps to a falling edge and then to a rising edge a second period later;
   the second switch signal is provided to the delayer, the delayed signal to a first input of the first AND gate and the first switch enable signal to a second input of the first AND gate, and the first AND gate is configured to output a first switch signal;
   upon the first switch signal jumping to a rising edge, the first switch is controlled to be closed and upon the first switch signal jumping to a falling edge, the first switch is controlled to be opened; and
   upon the second switch signal jumping to a rising edge, the second switch is controlled to be closed and upon the second switch signal jumping to a falling edge, the second switch is controlled to be opened.

2. The voltage detection circuit of claim 1, wherein the sampling circuit comprises a plurality of resistors connected in series into a series circuit, the series circuit being coupled to the supply voltage at one end and grounded at the other end.

3. The voltage detection circuit of claim 2, wherein a number of the plurality of resistors in the sampling circuit is 100.

4. A voltage detection circuit for a charge pump, comprising a sampling circuit, a latch circuit, wherein:
   the sampling circuit is configured to sample a supply voltage and provide the sampled voltage to the latch circuit;
   the latch circuit is configured to detect the sampled voltage and latch a result of the detection;
   the latch circuit is connected to a voltage regulation circuit which is configured to regulate a cascade structure of the charge pump based on the result of the detection so as to maintain an output voltage of the charge pump stable; and
   the latch circuit comprises a comparator having a non-inverting input coupled to the sampled voltage, an inverting input coupled to a reference voltage, and an output configured to output the result of the detection;
   wherein the latch circuit further comprises a first inverter and a second inverter,
   the first inverter having an input connected to an output of the second inverter, the first inverter having an output connected to an input of the second inverter, the input of the first inverter coupled to the output of the comparator, the output of the first inverter connected to the voltage regulation circuit;
   wherein the voltage detection circuit further comprises a signal generation circuit, wherein:
   the signal generation circuit comprises a pulse generator, a delayer and a first AND gate;
   the pulse generator is provided with a mode generating signal which causes the pulse generator to output a first switch enable signal and a second switch signal;
   the delayer is configured to output a delayed signal, wherein the delayed signal has a rising edge aligned with a falling edge of a signal provided to the delayer and a falling edge lagging behind a rising edge of the signal provided to the delayer by a first period;
   upon the mode generating signal creating a rising edge, the first switch enable signal jumps to a rising edge, and the second switch signal jumps to a falling edge and then to a rising edge a second period later;
   the second switch signal is provided to the delayer, the delayed signal to a first input of the first AND gate and the first switch enable signal to a second input of the first AND gate, and the first AND gate is configured to output a first switch signal;

upon the first switch signal jumping to a rising edge, the first switch is controlled to be closed and upon the first switch signal jumping to a falling edge, the first switch is controlled to be opened; and upon the second switch signal jumping to a rising edge, the second switch is controlled to be closed and upon the second switch signal jumping to a falling edge, the second switch is controlled to be opened.

5. The voltage detection circuit of claim 4, wherein the first period is 5 ns and the second period is 10 ns to 30 ns.

6. The voltage detection circuit of claim 4, further comprising a third switch, wherein:

upon an enable signal jumping to a rising edge, the third switch is controlled to be closed and upon the enable signal jumping to a falling edge, the third switch is controlled to be opened; and after the mode generating signal has jumped to the rising edge, the enable signal jumps to a rising edge upon the first switch signal jumping to the falling edge.

7. The voltage detection circuit of claim 4, wherein the sampling circuit comprises a plurality of resistors connected in series into a series circuit, the series circuit being coupled to the supply voltage at one end and grounded at the other end.

8. The voltage detection circuit of claim 7, wherein a number of the plurality of resistors in the sampling circuit is 100.

9. The voltage detection circuit of claim 4, wherein the latch circuit further comprises a first switch through which the supply voltage powers the comparator.

10. The voltage detection circuit of claim 4, wherein the latch circuit further comprises a second switch connected between the input of the first inverter and the output of the second inverter.

11. The voltage detection circuit of claim 4, wherein the first period is 5 ns and the second period is 10 ns to 30 ns.

12. The voltage detection circuit of claim 4, further comprising a third switch, wherein:

upon an enable signal jumping to a rising edge, the third switch is controlled to be closed and upon the enable signal jumping to a falling edge, the third switch is controlled to be opened; and after the mode generating signal has jumped to the rising edge, the enable signal jumps to a rising edge upon the first switch signal jumping to the falling edge.

* * * * *